United States Patent [19]
Real et al.

[11] Patent Number: 4,983,929
[45] Date of Patent: Jan. 8, 1991

[54] CASCODE CURRENT MIRROR

[75] Inventors: Peter Real, Groveland; David H. Robertson, Somerville, both of Mass.

[73] Assignee: Analog Devices, Inc., Norwood, Mass.

[21] Appl. No.: 413,183

[22] Filed: Sep. 27, 1989

[51] Int. Cl.$^5$ .............................................. H03F 3/16
[52] U.S. Cl. .................... 330/288; 330/277; 330/311
[58] Field of Search ............... 330/277, 288, 296, 310, 330/311; 323/315, 310

[56] References Cited

U.S. PATENT DOCUMENTS 4,550,284 10/1985 Sooch ............................. 330/288 X

OTHER PUBLICATIONS

Gray, P. R. and Meyer, R. G. "MOS Operational Amplifier Design—A Tutorial Overview", in *IEEE Journal of Solid-State Circuits*, vol. SC-17, No. 6, pp. 969-982, Dec. 1982.

Kerth, D. A.; Sooch, N. S. and Swanson, E. J. "A 12-bit 1-MHz Two-Step Flash ADC" in *IEEE Journal of Solid-State Circuits*, vol. 24, No. 2, pp. 250-255, Apr. 1989.

Allen, P. E. and Holberg, D. R., *CMOS Analog Circuit Design*, (Holt, Rinehart and Winston, Inc., N.Y., 1987), pp. 219-239.

Gray, P. R. and Meyer, R. G., *Analysis and Design of Analog Integrated Circuits*, Second Edition (John Wiley and Sons, N.Y., 1984); pp. 233-246; 518-519.

*Primary Examiner*—Steven Mottola
*Attorney, Agent, or Firm*—Wolf, Greenfield and Sacks

[57] ABSTRACT

A cascoded current mirror device is disclosed that is capable of producing an output current that is a direct function of an input current received by that device. The cascoded current mirror includes at least two portions connected together in a cascode manner. Provision is also made for feedback connection between those portions. This feedback connection can, for example, be a buffering connection. Voltage signals are generated by this device that can be used to drive and control additional output stages. Each such additional output stage is capable of producing an additional output current.

28 Claims, 3 Drawing Sheets

CASCODE CURRENT MIRROR

FIELD OF THE INVENTION

The present invention relates to devices for producing or processing currents, and more particularly to the variety of such devices commonly referred to as current mirrors.

BACKGROUND OF THE INVENTION

In the field of transistorized current sources, it has been a general practice to employ current mirrors as current sources. Current mirrors have also been used to mirror a varying input signal current. Although such devices have served the purpose, they have not proven entirely satisfactory under all conditions of service because each type of current mirror has a limited operating range for permissible input currents, unless differently sized devices are used for each different application. This problem is overcome by the present invention.

A current mirror receives an input current into one node, typically into a low impedance, and produces an output current at another node. That output current is a direct function (such as a reproduction or linear scaling) of the input current. In some cases, multiple (equal or unequal) currents may be produced for distribution to different output nodes. Increased output resistance and increased effective open circuit voltage can be obtained by a cascode multiple current mirror configuration. An alternative configuration is the Wilson current source, which utilizes negative feedback in lieu of a cascode configuration. Such a configuration has been found to have improved output compliance, which is the voltage range at the output node over which the current source continues to function as a proper current source. However, with the Wilson current mirror, the accuracy with which the output current mirrors the input current is reduced. The cascoded current mirror has better such accuracy, but reduced compliance. Such devices are described in Gray, P. R. and Meyer, R. G. *Analysis and Design of Analog Integrated Circuits*, Second Edition (John Wiley & Sons, New York 1984) pp. 233–246, 518–519 and 709–718, which is hereby incorporated by reference. Also see Allen, P. E. and Holberg, D. R. *CMOS Analog Circuit Design*, (Holt, Rinehart and Winston, Inc., New York, 1987) pp. 219–321 (especially pp. 219–239), which is also hereby incorporated by reference.

SUMMARY OF THE INVENTION

Accordingly, it is the general purpose of the present invention to provide apparatus capable of producing an output current that is a direct function of an input current received by that apparatus.

Other objects of the present invention are to provide apparatus for producing an output current that is a direction function of a received input current and which can do so over a wide range of input currents.

Briefly, these and other objects of the present invention are accomplished by a cascoded current mirror wherein provision is made for connection, such as a buffering connection, between the cascoded portions to provide feedback between such portions of the apparatus.

The term "terminal" as used herein is generically, is not limited to a lug or screw, and for example includes but is used not limited to an electrode such as defined in *McGraw-Hill Dictionary, intra*. For example, but without limitation, Parker, S. P., ed. *McGraw-Hill Dictionary of Scientific and Technical Terms* 3rd ed. (McGraw-Hill, New York, 1984) at page 1623 has a definition of "terminal" as "One of the electric input or output points of a circuit or component." When referring to a transistor, such a terminal can for example (but without limitation) be an emitter region.

One such device comprises apparatus for producing an output current that is a direct function of an input current received by that apparatus, the apparatus comprising a first active semiconductor device including at least first, second and third terminals; a second active semiconductor device including at least first, second and third terminals wherein the first terminal of the first device is operably connected to the first terminal of the second device and wherein the third terminal of the first device is operably connected to the third terminal of the second device; a third active semiconductor device including at least first, second and third terminals wherein the first terminal of the third device is operably connected to the second terminal of the first device; a fourth active semiconductor device including at least first, second and third terminals wherein the first terminal of the fourth device is operably connected to the second terminal of the second device, wherein the third terminal of the fourth device is operably connected to the third terminal of the third device; a fifth active semiconductor device including at least first, second and third terminals wherein the first terminal of the fifth device is operably connected to the third terminal of each of the first and second devices and wherein the third terminal of the fifth device is operably connected to the second terminal of the third device; a sixth active semiconductor device including at least first, second and third terminals wherein the first terminal of the sixth device is operably connected to the first terminal of the first device and the first terminal of the second device, and wherein the second and third terminals of the sixth device are operably connected to the third terminal of the first device, to the third terminal of the fifth device and to the first terminal of the fifth device; and a seventh active semiconductor device including at least first, second and third terminals wherein the first terminal of the seventh device is operably connected to the first terminal of each of the first, second and sixth devices, and wherein the second and third terminals of the seventh device are operably connected to the third terminal of each of the third and fourth devices; whereby an input current applied to the second terminal of the third device into the third terminal of the fifth device will result in production at the second terminal of the fourth device of an output current that is a direct function of that input current. Each of the first, second, third, fourth, fifth, sixth and seventh active semiconductor devices can for example each comprise a transistor. Each of the first, second, third, fourth, fifth, sixth and seventh active semiconductor devices can for example each comprise a field effect transistor wherein the first terminal of each of the active semiconductor devices comprises a source terminal of that device, the second terminal of each of the active semiconductor devices comprises a drain terminal of that device, and the third terminal of each of the active semiconductor devices comprises a gate terminal of that device. Each of the active semi-conductor devices can for example comprise a bipolar transistor wherein the first terminal of each of the active semiconductor devices comprises an emitter terminal of that device, the second terminal of each of the active semiconductor devices comprises a collector terminal of that device, and the third terminal of each of the active semiconductor devices comprises a base terminal of that device.

As another example, apparatus is provided for producing an output current that is a direct function of an input current received by that apparatus, the apparatus comprising a first active semiconductor device including at least first, second and third terminals; a second active semiconductor device including at least first, second and third terminals wherein the first terminal of the first device is operably connected to the first terminal of the second device and wherein the third terminal of the first device is operably connected to the third terminal of the second device; a third active semiconductor device including at least first, second and third terminals wherein the first terminal of the third device is operably connected to the second terminal of the first device; a fourth active semiconductor device including at least first, second and third terminals wherein the first terminal of the fourth device is operably connected to the second terminal of the second device, and wherein the third terminal of the fourth device is operably connected to the third terminal of the third device; a fifth active semiconductor device including at least first, second and third terminals wherein the first terminal of the fifth device is operably connected to the third terminal of each of the first and second devices and wherein the third terminal of the fifth device is operably connected to the second terminal of the third device; a first impedance device including at least first and second terminals wherein the first terminal of the first impedance device is operably connected to the first terminal of the first active semiconductor device and to the first terminal of the second active semiconductor device, and wherein the second terminal of the first impedance device is operably connected to the third terminal of the first active semiconductor device, to the third terminal of the second active semiconductor device and to the first terminal of the fifth active semiconductor device; and a second impedance device including at least first and second terminals wherein the first terminal of the second impedance device is operably connected to the first terminal of each of the first and second active semiconductor devices and the first impedance device, and wherein the second terminal of the second impedance device is operably connected to the third terminal of each of the third and fourth active semiconductor devices; whereby an input current applied to the second terminal of the third device and to the third terminal of the fifth device results in production at the second terminal of the fourth device of an output current that is a direct function of that input current. The first, second, third, fourth and fifth active semiconductor devices can for example each comprise a transistor. Each of the first, second, third, fourth and fifth active semiconductor devices can for example each comprise a field effect transistor, wherein the first terminal of each such field effect transistor comprises a source terminal of that FET, the second terminal of each such FET comprises a drain terminal of that FET and the third terminal of each such FET comprises a gate terminal of that FET. Each of the active semiconductor devices can for example comprise a bipolar transistor, wherein the first terminal of each such bipolar transistor comprises an emitter terminal of that bipolar transistor, the second terminal of each such bipolar transistor comprises a collector terminal that bipolar transistor, and the third terminal of each such bipolar transistor comprises a base terminal of that bipolar transistor.

As another example, apparatus is provided for producing an output current that is a direct function of an input current received by that apparatus, the apparatus comprising a first active semiconductor device including at least first, second and third terminals; a second active semiconductor device including at least first, second and third terminals wherein the first terminal of the first device is operably connected to the first terminal of the second device and wherein the third terminal of the first device is operably connected to the third terminal of the second device; a third active semiconductor device including at least first, second and third terminals wherein the first terminal of the third device is operably connected to the second terminal of the first device, and wherein the second terminal of the third device is operably connected to the third terminal of the first device and to the third terminal of the second device; a fourth active semiconductor device including at least first, second and third terminals wherein the first terminal of the fourth device is operably connected to the second terminal of the second device, wherein the third terminal of the fourth device is operably connected to the third terminal of the third device; a fifth active semiconductor device including at least first, second and third terminals wherein the first terminal of the fifth device is operably connected to the first terminal of each of the first and second devices, and wherein the second and third terminals of the fifth device are operably connected to the third terminal of each of the third and fourth devices; whereby an input current applied to the second terminal of the third device will result in production at the second terminal of the fourth device of an output current that is a direct function of that input current.

As another example, apparatus is provided for producing an output current that is a direct function of an input current received by that apparatus, the apparatus comprising a first active semiconductor device including at least first, second and third terminals; a second active semiconductor device including at least first, second and third terminals wherein the first terminal of the first device is operably connected to the first terminal of the second device and wherein the third terminal of the first device is operably connected to the third terminal of the second device; a third active semiconductor device including at least first, second and third terminals wherein the first terminal of the third device is operably connected to the second terminal of the first devices and wherein the second terminal of the third device is operably connected to the third terminal of the first device and to the third terminal of the second device; a fourth active semiconductor device including at least first, second and third terminals wherein the first terminal of the fourth device is operably connected to the second terminal of the second device, wherein the third terminal of the fourth device is operably connected to the third terminal of the third device; a first impedance device including at least first and second terminals wherein the first terminal of the first impedance device is operably connected to the first terminal of each of the first and second active semiconductor devices, and wherein the second and third terminals of the first impedance device are operably connected to the third terminal of each of the third and fourth active semiconductor devices; whereby an input current applied to the second terminal of the third active semiconductor device will result in production at the second terminal of the fourth active semiconductor device of an output current that is a direct function of that input current.

Other objects, advantages and novel features of the invention will become apparent from the following detailed description of the invention when considered in conjunction with the accompanying drawing.

DETAILED DESCRIPTION

Figure 1:
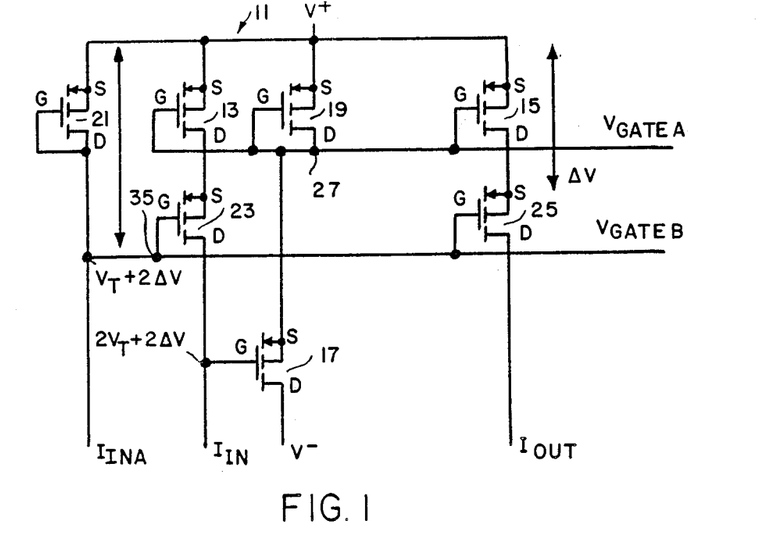
FIG. 1 is a schematic diagram of one embodiment of a current mirror according to the present invention.
Figure 5:
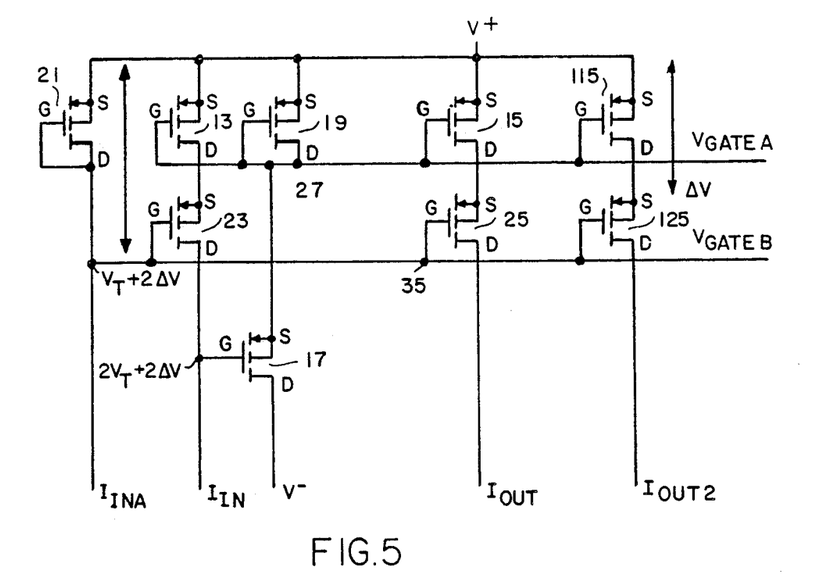
FIG. 5 is a schematic diagram of a further embodiment of a further current mirror according to the present invention.
Figure 6:
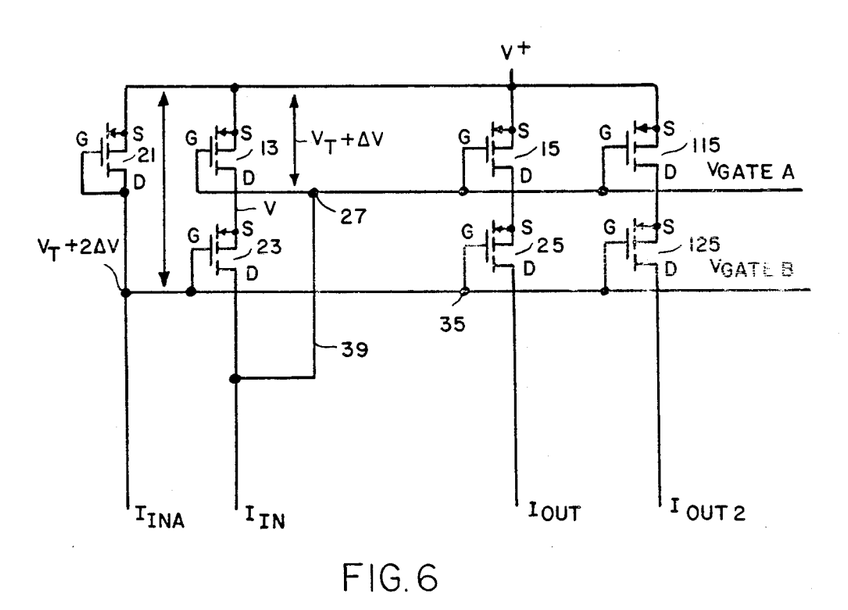
FIG. 6 is a schematic diagram of a still further embodiment of a still further current mirror according to the present invention.

Referring now to the drawing, wherein like reference characters designate like or corresponding parts throughout the several views, there is shown in FIG. 1 a current mirror 11 including P-channel metal oxide-semiconductor (MOS) field effect transistors (FETs) 13, 15, 17, 19, 21, 23 and 27. For FETs 19 and 21, the respective gate and drain are connected to each other, to help ensure that these transistors remain in saturation. The input current $I_{IN}$ controls through FET 17 the node 27 from which the V $_{Gate\ A}$ signal is produced. FET 17 is here connected to act as a source follower. As shown in FIGS. 5 and 6, the $V_{Gate\ A}$ signal and the $V_{Gate\ B}$ signal are generated by the present invention to drive and control additional output stages. FET 19 is used to bias source follower FET 17. As a result, FET 23 is held in the saturated region of operation, which is desirable for proper performance, and the impedance at the node 27 V $_{Gate\ A}$ output is set by the transconductance of FETs 17 and 19. However, inclusion of FET 17 necessitates additional current to bias FET 17. In this case, AC capacitive compensation may be added to the node to which the input current $I_{IN}$ is applied to ensure stable operation.

In the embodiment of FIG. 1, input current $I_{IN}$ controls output current $I_{OUT}$. The gate-to-source voltage V $_{GS\ 15}$ applied to FET 15 controls the output current produced by FET 15 and also determines the output current produced by FET 13. The current produced by FET 13 in turn controls FET 23 at the node to which input current $I_{IN}$ is applied. Source follower FET 17 acts as a voltage buffer, and is connected via a feedback loop to FET 19. Taken together, FET 17 and FET 19, connected in the manner shown in FIG. 1, provide what may be considered to be an ideal voltage source producing a constant voltage of about 0.7 volts. This buffer voltage is applied to node 27 (from which control voltage V $_{Gate\ A}$ is produced), via a negative feedback loop. This loop tends to make the drain current $I_D$ 13 produced by FET 13 to be substantially equal to the input current $I_{IN}$. However, these two currents are often not equal, due in part to any parasitic capacitance at the node 27 at which FET 13 and 19 are connected. In the event of such a mismatch, net current necessarily would be flowing out of the parasitic capacitance at that node, and to ground. The voltage applied to FET 13 would continue to change until currents $I_{IN}$ and $I_D$ are equal.

In FIG. 1, FETs 17 and 19 together may be considered to operate like an amplifier having an infinite input impedance, that controls the node 27 and control voltage V $_{Gate\ A}$ produced thereat. FETs 23 and 25 are connected in a cascode configuration with FETs 13 and 15. FET 21 in effect acts as a resistor having supply voltage $V_+$ applied thereto and providing to FETs 23 and 25 the appropriate voltage for saturation. For the device of FIG. 1 to operate properly, all transistors 13 through 25 must operate in the saturation region, necessitating sufficient drain to-source voltage $V_{DS}$ across each such transistor to saturate it. The buffer provided by FETs 17 and 19 gives more leeway for drain-to-source voltage $V_{DS\ 23}$ of FET 23 within which that transistor would remain saturated. Accordingly, the device of FIG. 1 remains properly functional over a wide variety of input current $I_{IN}$ values.

Second input current $I_{INA}$ is applied to scaled FET 21 to generate cascode control voltage $V_{Gate\ B}$. $I_{INA}$ should be nominally the same as $I_{IN}$, but need not match precisely. Although precision of input current $I_{IN}$ is needed for precision of output current $I_{OUT}$, such precision is not critical for input current $I_{INA}$. Input current $I_{INA}$ is used to set up a bias condition, so it would suffice if $I_{INA}$ is roughly similar to input current $I_{IN}$.

$V-$ can be a negative bias voltage, a negative supply voltage, or a ground. $V-$ can be a negative bias voltage, a negative supply voltage, or a ground. $V-$ is utilized to dispose of current from FET 17.

For proper operation of current source 11, all transistors 13 through 25 must be saturated. Also, for proper operation of the device of FIG. 2, and for proper operation of the device of FIG. 3, all of the transistors shown therein must be saturated. For a transistor to be saturated, its drain-to-source voltage $V_{DS}$ must be sufficient. For the device to be on, its gate to source voltage $V_{GS}$ must be greater than the threshold voltage $V_T$. In addition, for saturation the drain to source voltage $V_{DS}$ must be greater than $V_{GS}-V_T$, for the device to have sufficient drain-to-source voltage to be saturated. Accordingly, with an increased gate-to-source voltage $V_{GS}$, the drain-to-source voltage $V_{DS}$ required for saturation is increased. Unless FET 23 is buffered, the drain-to-source voltage applied thereto is limited. As a result, current source 11 without such buffering would have a more limited range of input current $I_{IN}$ values over which FET 23 would be saturated, resulting in a limited input current range of operation for current source 11. In other words, without buffering, FET 23 would have limited $V_{DS}$ headroom. The buffer provided by FET 17 with FET 19 provides FET 23 with more headroom by increasing the drain-to-source voltage applied to FET 23. This improved headroom permits current source 11 to drive a load over a wider voltage swing, and to operate over a wider range of input current $I_{IN}$ values. The voltage amplitude at the gate of FET 23 and to the gate of FET 17 can thereby be reduced. Increasing such headroom also reduces headroom used up by current mirror 11.

Figure 2:
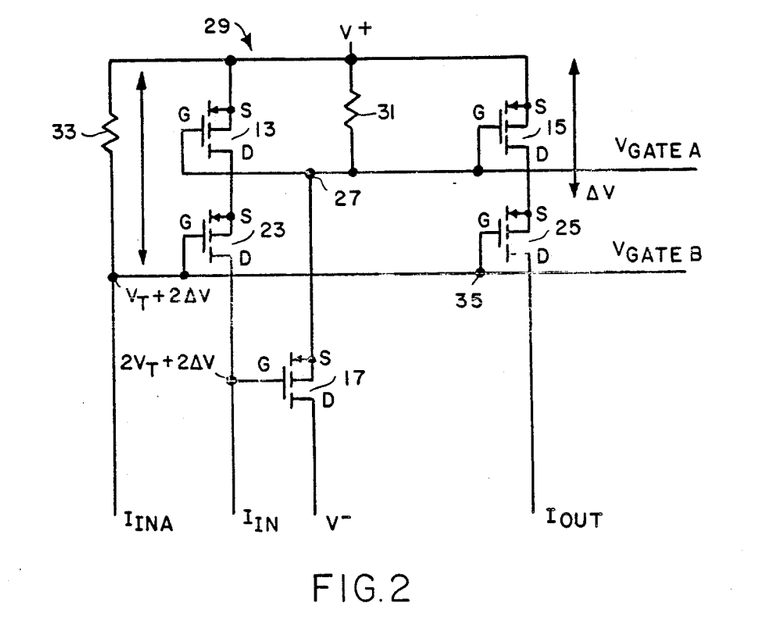
FIG. 2 is a schematic diagram of another embodiment of another current mirror according to the present invention.

As discussed above, FET 21 can be replaced with a resistor. Also, in the buffer utilized in the present invention, FET 19 can be replaced with a resistor. Such a current source 29 is illustrated in FIG. 2. Therein, FET 19 of FIG. 1 has been replaced with a resistor 19 connected between positive supply voltage V+ and node 27 to which the $V_{Gate\ A}$ input is supplied. Also, FET 21 of FIG. 1 is replaced in FIG. 2 with a resistor also connected between supply voltage V+ and node 35, at which voltage $V_{Gate\ B}$ appears. FET 17 and resistor 31 together provide buffering to FET 23. Because of such buffering, the saturation region headroom for FET 23 is increased, permitting proper operation of current source 29 over a wider range than would have been possible without the buffering provided by FET 17 and resistor 31.

Figure 3:
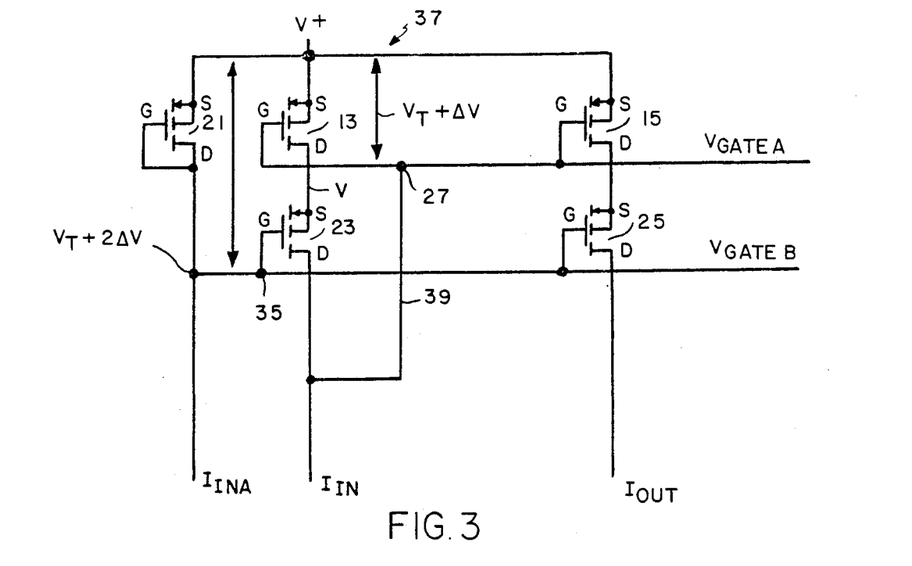
FIG. 3 is a schematic diagram of still another embodiment of still another current mirror according to the present invention.

Although buffering of FET 23 is preferred, it is not necessary to proper operation of the invention. An operable current source 37 without such buffering is illustrated by the diagrammatic representation of FIG. 3. In FIG. 3, the buffer of FET 17 with FET 19 or resistor 31 has been replaced with conductor 39 connecting nodes 27 and 35. The elimination of FET 17 also results in elimination of supply voltage V−. Again, because of the scaling of FET 21, cascode voltage $V_{Gate\ B}$ will be at an appropriate voltage to keep FET 13 and FET 15 just in the saturated region, provided FET 23 and FET 25 are sized the same as FET 13 and FET 15 respectively. This configuration satisfies the criterion that FET 13 and FET 15 see the same drain voltage, and that the compliance in output current $I_{OUT}$ be at the desirable level of twice the difference between $V_{GS}$ and $V_T$. However, in FIG. 3, the drain to source voltage of $V_{DS}$ of FET 23 is the threshold voltage $V_T$. If input current $I_{IN}$ is sufficiently large, then the difference between $V_{GS}$ and $V_T$ would be greater than threshold voltage $V_T$. In that situation, FET 23 would not be in saturation, introducing a mismatch between input current $I_{IN}$ and output current $I_{OUT}$. As discussed above, this could make current source 37 operable under a narrower range of input current $I_{IN}$ values than would have been possible had the buffering of FIG. 1 or FIG. 2 been utilized in lieu of conductor 39. Also, it may be necessary to apply some capacitance between supply voltage V+ and node 27 to discourage ringing in the feedback loop; the specifics of this will be dependent on the specific process and current densities used.

Figure 4:
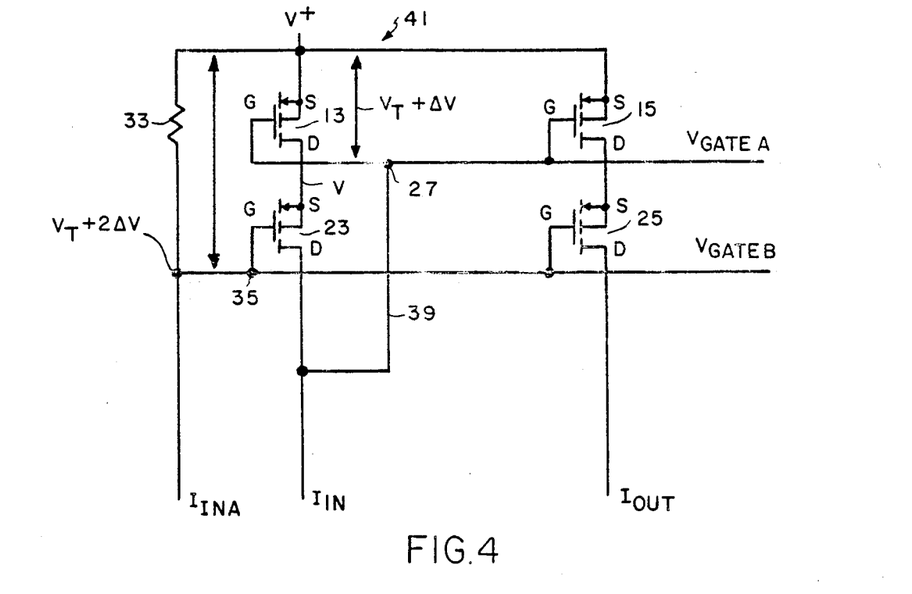
FIG. 4 is a schematic diagram of yet another embodiment of yet another current mirror according to the present invention.

An alternative configuration to that of FIG. 3 is illustrated in FIG. 4. As discussed above, FET 21 of FIG. 3 can be replaced with resistor 33.

In FIGS. 1 and 3, the W/L ratio between FET diffusion width and FET diffusion length for FET 21 is preferably ¼ of the ratio for any of the other FETs utilized in the current mirror illustrated. This results in a scaled device 21 to which an extra input current $I_{INA}$ (which can be the same as $I_{IN}$) is applied to generate a cascode control voltage $V_{Gate\ B}$. Because of this scaling of FET 21, voltage $V_{Gate\ B}$ will be at an appropriate voltage to keep FETs 13 and 15 just in the saturated region, provided FET 23 and FET 25 are sized the same as FET 13 and FET 15 respectively. As a result, FET 13 and FET 15 will each see the same drain voltage.

As shown in FIGS. 5 and 6, FETs 15 and 25 can be replicated as many times as desired. Generation of voltages $V_{Gate\ A}$ and $V_{Gate\ B}$ as discussed above, and provision of those voltages to corresponding ones of such additional FETs, enables inclusion of such additional FETs. For example, as shown in FIG. 5, the configuration of FIG. 1 can be augmented by the addition of FET 115 and FET 125. The gate of FET 115 is connected to received voltage $V_{Gate\ A}$, and the gate of FET 125 is connected to receive voltage $V_{Gate\ B}$. Also, as shown in FIG. 6, the configuration of FIG. 3 can be augmented by inclusion of additional FETs 115 and 125. The gate of FET 115 is connected to receive voltage $V_{Gate\ A}$, and the gate of FET 125 is connected to receive voltage $V_{Gate\ B}$. Again, FET 19 and FET 21 of FIG. 5 can each be replaced with a resistor, such as is shown in FIG. 2. Also, FET 21 of FIG. 6 can be replaced with a resistor, as shown in FIG. 4. In FIG. 5 and in FIG. 6, additional FET 125 produces an output current $I_{OUT}2$. Additional pairs of FET 215, 225, 315, 325, 415, 425, etc. can be added to any of the configurations of FIGS. 1 through 6, provided that the gate of each such additional FET is connected to receive voltage or voltage $V_{Gate\ A}$ or voltage $V_{Gate\ B}$, as appropriate. In each case, the second additional FET 125, 225, 325, 425, etc. would produce another output current $I_{OUT2}$, $I_{OUT3}$, $I_{OUT4}$, or $I_{OUT5}$, etc. The relationship between the input current $I_{IN}$ and any output current can be determined by scaling of a corresponding pair of FETs 15 and 25, 115 and 125, 215 and 225, 315 and 325, 415 and 425, etc. As one example, if the ratio of diffusion width to diffusion length of FET 15 and FET 25 is substantially identical to the corresponding ratio of FET 13 and FET 23, then output current $I_{OUT}$ produced thereby would be substantially equal to input current $I_{IN}$. If, however, the ratio of diffusion width to diffusion length of FET 115 and of FET 125 is twice that of FET 13 and FET 23, then output current $I_{OUT2}$ produced thereby would be substantially equal to twice input current $I_{IN}$. Such scaling of FETs 115 and 125 is preferably accomplished by appropriately setting the diffusion width of those FETs. For the example just given, where output current $I_{OUT2}$ is to be twice input current $I_{IN}$, the diffusion width of FET 115 and the diffusion width of FET 125 should be twice the diffusion width of FET 13 and of FET 23. Other proportions and relationships between $I_{IN}$ and an output current of the present invention can be set as desired by such scaling of the pair of FETs 15 and 25, 115 and 125, etc. from which that output current is produced.

It should be understood that, although FETs are preferred, the present invention can be used in similar fashion with similar operation with devices other than those illustrated. For example, the transistors illustrated in FIGS. 1 through 4 can be n-channel FETs, p-channel FETs, CMOS, or bipolar transistors. Although PMOS transistors are illustrated, all topologies shown in the drawings are equally valid for NMOS transistors. Additionally, the illustrated topologies are useful for a wide range of possible device geometries, e.g., lengths and widths of diffusion regions.

Some of the many advantages of the invention should now be readily apparent. For example, a novel current mirror has been provided which is capable of producing an output current that is a direct function of an input current received by that apparatus. Higher accuracy mirror functions are provided over wider ranges of input currents through the provision of additional headroom for saturation operation. A precision current mirror has been provided featuring high output impedance, accurate mirroring at arbitrary scaling factors, and improved voltage compliance at the output current nodes. The present invention is capable of producing an output current that is a direct function of a received input current, and is capable of doing so over a substantially wide range of input currents.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. Apparatus for producing an output current that is a direct function of an input current received by that apparatus, comprising:
    a first active semiconductor device including at least first, second and third terminals;
    a second active semiconductor device including at least first, second and third terminals wherein said first terminal of said first device is operably connected to said first terminal of said second device and wherein said third terminal of said first device is operably connected to said third terminal of said second device;
    a third active semiconductor device including at least first, second and third terminals wherein said first terminal of said third device is operably connected to said second terminal of said first device;
    a fourth active semiconductor device including at least first, second and third terminals wherein said first terminal of said fourth device is operably connected to said second terminal of said second device, wherein said third terminal of said fourth device is operably connected to said third terminal of said third device;
    a fifth active semiconductor device including at least first, second and third terminals wherein said first terminal of said fifth device is operably connected to said third terminal of each of said first and second devices and wherein said third terminal of said fifth device is operably connected to said second terminal of said third device;
    a sixth active semiconductor device including at least first, second and third terminals wherein said first terminal of said sixth device is operably connected to said first terminal of said first device and said first terminal of said second device, and wherein said second and third terminals of said sixth device are operably connected to said third terminal of said first device, to said third terminal of said second device and to said first terminal of said fifth device; and
    a seventh active semiconductor device including at least first, second and third terminals wherein said first terminal of said seventh device is operably connected to said first terminal of each of said first, second and sixth devices, and wherein said second and third terminals of said seventh device are operably connected to said third terminal of each of said third and fourth devices;
    whereby an input current applied to said second terminal of said third device and to said third terminal of said fifth device results in production at said second terminal of said fourth device of a first output current that is a direct function of that input current.

2. Apparatus as recited in claim 1, wherein each of said first, second, third, fourth, fifth, sixth and seventh active semiconductor devices, each comprises a transistor.

3. Apparatus as recited in claim 1 wherein:
    each of said first, second, third, fourth, fifth, sixth and seventh active semiconductor devices each comprises a field effect transistor;
    said first terminal of each of said active semiconductor devices comprises a source terminal of that device;
    said second terminal of each of said active semiconductor devices comprises a drain terminal of that device; and
    said third terminal of each of said active semiconductor devices comprises a gate terminal of that device.

4. Apparatus as recited in claim 1 wherein:
    each of said active semiconductor devices comprises a bipolar transistor;
    said first terminal of each of said active semiconductor devices comprises an emitter terminal of that device;
    said second terminal of each of said active semiconductor devices comprises a collector terminal of that device; and
    said third terminal of each of said active semiconductor devices comprises a base terminal of that device.

5. Apparatus as recited in claim 1, further comprising:
    an eighth active semiconductor device including at least first, second and third terminals wherein said first terminal of said eighth device is is operably connected to said first terminal of each of said first, second, sixth and seventh devices, and wherein said third terminal of said eighth device is operable connected to said third terminal of each of said first, second and sixth devices and to said second terminal of said sixth device and to said first terminal of said fifth device; and
    a ninth active semiconductor device including at least first, second and third terminals wherein said first terminal of said ninth device is operably connected to said second terminal of said eighth device, and wherein said third terminal of said ninth device is operably connected to said third terminal of each of said third, fourth and seventh devices and to said second terminal of said seventh device;
    whereby an input current applied to said second terminal of said third device and to said third terminal of said fifth device also results in production at said second terminal of said ninth device of a second output current that is a direct function of that input current.

6. Apparatus as recited in claim 1, further comprising:
    a first plurality of active semiconductor devices each including at least first, second and third terminals wherein said first terminal of each of said first plurality of devices is operably connected to said first terminal of each of said first, second, sixth and seventh devices, and wherein said third terminal of each of said first plurality of devices is operably connected to said third terminal of each of said first, second and sixth devices and to said second terminal of said sixth device and to said first terminal of said fifth device; and
    a second plurality of active semiconductor devices each including at least first, second and third terminals wherein said first terminals of said second plurality of devices are each respectively operably connected to a said second terminal of a corresponding device of said first plurality of devices, and wherein said third terminal of each of said second plurality of devices is operably connected to said third terminal of each of said third, fourth and seventh devices and to said second terminal of said seventh device;

whereby an input current applied to said second terminal of said third device and to said third terminal of said fifth device also results in production, at each of said second terminals of said second plurality of devices, of a plurality of output currents that are each a direct function of that input current.

7. Apparatus for producing an output current that is a direct function of an input current received by that apparatus, comprising:
a first active semiconductor device including at least first, second and third terminals;
a second active semiconductor device including at least first, second and third terminals wherein said first terminal of said first device is operably connected to said first terminal of said second device and wherein said third terminal of said first device is operably connected to said third terminal of said second device;
a third active semiconductor device including at least first, second and third terminals wherein said first terminal of said third device is operably connected to said second terminal of said first device;
a fourth active semiconductor device including at least first second and third terminals wherein said first terminal of said fourth device is operably connected to said second terminal of said second device, wherein said third terminal of said fourth device is operably connected to said third terminal of said third device;
a fifth active semiconductor device including at least first, second and third terminals wherein said first terminal of said fifth device is operably connected to said third terminal of each of said first and second devices and wherein said third terminal of said fifth device is operably connected to said second terminal of said third device;
a first impedance device including at least first and second terminals wherein said first terminal of said first impedance device is operably connected to said first terminal of said first active semiconductor device and to said first terminal of said second active semiconductor device, and wherein said second terminal of said first impedance device is operably connected to said third terminal of said first active semiconductor device, to said third terminal of said second active semiconductor device and to said first terminal of said fifth active semiconductor device; and
a second impedance device including at least first and second terminals wherein said first terminal of said second impedance device is operably connected to said first terminal of each of said first and second active semiconductor devices and said first impedance device, and wherein said second terminal of said second impedance device is operably connected to said third terminal of each of said third and fourth active semiconductor devices;

whereby an input current applied to said second terminal of said third active semiconductor device and to said third terminal of said fifth active semiconductor device results in production at said second terminal of said fourth active semiconductor device of a first output current that is a direct function of that input current.

8. Apparatus as recited in claim 7, wherein each of said first, second, third, fourth and fifth active semiconductor devices, each comprises a transistor.

9. Apparatus as recited in claim 7 wherein:
each of said first, second, third, fourth and fifth active semiconductor devices each comprises a field effect transistor;
said first terminal of each of said active semiconductor devices comprises a source terminal of that device;
said second terminal of each of said active semiconductor devices comprises a drain terminal of that device; and
said third terminal of each of said active semiconductor devices comprises a gate terminal of that device.

10. Apparatus as recited in claim 7 wherein:
each of said active semiconductor devices comprises a bipolar transistor;
said first terminal of each of said active semiconductor devices comprises an emitter terminal of that device;
said second terminal of each of said active semiconductor devices comprises a collector terminal of that device; and
said third terminal of each of said active semiconductor devices comprises a base terminal of that device.

11. Apparatus as recited in claim 7 wherein:
said first impedance device comprises a resistor; and
said second impedance device comprises a resistor.

12. Apparatus as recited in claim 7 wherein:
said first impedance device comprises a first transistor having two terminals connected together; and
said second impedance device comprises a second transistor having two terminals connected together.

13. Apparatus as recited in claim 7, further comprising:
a sixth active semiconductor device including at least first, second and third terminals wherein said first terminal of said sixth device is operably connected to said first terminal of each of said first and second active semiconductor devices, and to said first terminal of each of said first and second impedance devices, and wherein said third terminal of said sixth device is operably connected to said third terminal of each of said first and second active semiconductor devices and to said second terminal of said first impedance device and to said first terminal of said fifth active semiconductor device; and
a seventh active semiconductor device including at least first, second and third terminals wherein said first terminal of said seventh device is operably connected to said second terminal of said sixth device, and wherein said third terminal of said seventh device is operably connected to said third terminal of each of said third and fourth active semiconductor devices and to said second terminal of said second impedance device;
whereby an input current applied to said second terminal of said third device and to said third terminal of said fifth device also results in production at said second terminal of said seventh device of a second output current that is a direct function of that input current.

14. Apparatus as recited in claim 7, further comprising:
a first plurality of active semiconductor devices each including at least first, second and third terminals wherein said first terminal of each of said first plurality of devices is operably connected to said first terminal of each of said first and second active semiconductor devices and to said first terminal of each of said first and second impedance devices, and wherein said third terminal of each of said first plurality of devices is operably connected to said third terminal of each of said first and second active semiconductor devices and to said second terminal of said first impedance device and to said first terminal of said fifth active semiconductor device; and
a second plurality of active semiconductor devices each including at least first, second and third terminals wherein said first terminals of said second plurality if devices are each respectively operably connected to a said second terminal of a corresponding device of said first plurality of devices, and wherein said third terminal of each of said second plurality of devices is operably connected to said third terminal of each of said third and fourth active semiconductor devices and to said second terminal of said second impedance device;
whereby an input current applied to said second terminal of said third device and to said third terminal of said fifth device also results in production, at each of said second terminals of said second plurality of devices, of a plurality of output currents that are each a direct function of that input current.

15. Apparatus for producing an output current that is a direct function of an input current received by that apparatus, comprising:
a first active semiconductor device including at least first, second and third terminals;
a second active semiconductor device including at least first, second and third terminals wherein said first terminal of said first device is operably connected to said first terminal of said second device and wherein said third terminal of said first device is operably connected to said third terminal of said second device;
a third active semiconductor device including at least first, second and third terminals wherein said first terminal of said third device is operably connected to said second terminal of said first device, and wherein said second terminal of said third device is operably connected to said third terminal of said first device and to said third terminal of said second device;
a fourth active semiconductor device including at least first, second and third terminals wherein said first terminal of said fourth device is operably connected to said second terminal of said second device, wherein said third terminal of said fourth device is operably connected to said third terminal of said third device;
a fifth active semiconductor device including at least first, second and third terminals wherein said first terminal of said fifth device is operably connected to said first terminal of each of said first and second devices, and wherein said second and third terminals of said fifth device are operably connected to said third terminal of each of said third and fourth devices;
whereby an input current applied to said second terminal of said third device results in production at said second terminal of said fourth device of a first output current that is a direct function of that input current.

16. Apparatus as recited in claim 15, wherein each of said first, second, third, fourth and fifth active semiconductor devices, each comprises a transistor.

17. Apparatus as recited in claim 15 wherein:
each of said first, second, third, fourth and fifth active semiconductor devices each comprises a field effect transistor;
said first terminal of each of said active semiconductor devices comprises a source terminal of that device;
said second terminal of said active semiconductor devices comprise a drain terminal of that device; and
said third terminal of each of said active semiconductor devices comprises a gate terminal of that device.

18. Apparatus as recited in claim 15 wherein:
each of said active semiconductor devices comprises a bipolar transistor;
said first terminal of each of said active semiconductor devices comprises an emitter terminal of that device;
said second terminal of each of said active semiconductor devices comprises a collector terminal of that device; and
said third terminal of each of said active semiconductor devices comprises a base terminal of that device.

19. Apparatus as recited in claim 15, further comprising:
a sixth active semiconductor device including at least first, second and third terminals wherein said first terminal of said sixth device is is operably connected to said first terminal of each of said first and second devices, and wherein said third terminal of said sixth device is operably connected to said third terminal of each of said first and second devices and to said first terminal of said fifth device; and
a seventh active semiconductor device including at least first, second and third terminals wherein said first terminal of said seventh device is operably connected to said second terminal of said sixth device, and wherein said third terminal of said seventh device is operably connected to said third terminal of each of said third and fourth devices;
whereby an input current applied to said second terminal of said third device and to said third terminal of said fifth device also results in production at said second terminal of said seventh device of a second output current that is a direct function of that input current.

20. Apparatus as recited in claim 15, further comprising:
a first plurality of active semiconductor devices each including at least first, second and third terminals wherein said first terminal of each of said first plurality of devices is operably connected to said first terminal of each of said first and second devices, and wherein said third terminal of each of said first plurality of devices is operably connected to said third terminal of each of said first and second devices and to said first terminal of said fifth device; and a second plurality of active semiconductor devices each including at least first, second and third terminals wherein said first terminals of said second plurality of devices are each respectively operably connected to a said second terminal of a corresponding device of said first plurality of devices, and wherein said third terminal of each of said second plurality of devices is operably connected to said third terminal of each of said third and fourth devices;

whereby an input current applied to said second terminal of said third device and to said third terminal of said fifth device also results in production, at each of said second terminals of said second plurality of devices, of a plurality of output currents that are each a direct function of that input current.

21. Apparatus for producing an output current that is a direct function of an input current received by that apparatus, comprising:

a first active semiconductor device including at least first, second and third terminals;

a second active semiconductor device including at least first, second and third terminals wherein said first terminal of said first device is operably connected to said first terminal of said second device and wherein said third terminal of said first device is operably connected to said third terminal of said second device;

a third active semiconductor device including at least first, second and third terminals wherein said first terminal of said third device is operably connected to said second terminal of said first devices and wherein said second terminal of said third devices is operably connected to said third terminal of said first device and to said third terminal of said second device;

a fourth active semiconductor device including at least first, second and third terminals wherein said first terminal of said fourth device is operably connected to said second terminal of said second device, wherein said third terminal of said fourth device is operably connected to said third terminal of said third device;

a first impedance device including at least first and second terminals wherein said first terminal of said first impedance device is operably connected to said first terminal of each of said first and second active semiconductor devices, and wherein said second and third terminals of said first impedance device are operably connected to said third terminal of each of said third and fourth active semiconductor devices;

whereby an input current applied to said second terminal of said third active semiconductor device results in production at said second terminal of said fourth active semiconductor device of a first output current that is a direct function of that input current.

22. Apparatus as recited in claim 21, wherein each of said first, second, third and fourth active semiconductor devices, each comprises a transistor.

23. Apparatus as recited in claim 21 wherein:
each of said first, second, third and fourth active semiconductor devices each comprises a field effect transistor;

said first terminal of each of said active semiconductor devices comprises a source terminal of that device;

said second terminal of each of said active semiconductor devices comprises a drain terminal of that device; and said third terminal of each of said active semiconductor devices comprises a gate terminal of that device.

24. Apparatus as recited in claim 21 wherein:
each of said active semiconductor devices comprises a bipolar transistor;

said first terminal of each of said active semiconductor devices comprises an emitter terminal of that device;

said second terminal of each of said active semiconductor devices comprises a collector terminal of that device; and said third terminal of each of said active semiconductor devices comprises a base terminal of that device.

25. Apparatus as recited in claim 21 wherein said first impedance device comprises a resistor.

26. Apparatus as recited in claim 21 wherein said first impedance device comprises a transistor having two terminals connected together.

27. Apparatus as recited in claim 21, further comprising:

a fifth active semiconductor device including at least first, second and third terminals wherein said first terminal of said fifth device is is operably connected to said first terminal of each of said first and second active semiconductor devices and to said first terminal of said first impedance device, and wherein said third terminal of said fifth device is operably connected to said third terminal of each of said first and second active semiconductor devices and to said second terminal of said first impedance device;

a sixth active semiconductor device including at least first, second and third terminals wherein said first terminal of said sixth device is operably connected to said second terminal of said fifth device, and wherein said third terminal of said sixth device is operably connected to said third terminal of each of said third and fourth active semiconductor devices;

whereby an input current applied to said second terminal of said third device also results in production at said second terminal of said sixth device of a second output current that is a direct function of that input current.

28. Apparatus as recited in claim 21, further comprising:

a first plurality of active semiconductor devices each including at least first, second and third terminals wherein said first terminal of each of said first plurality of devices is operably connected to said first terminal of each of said first and second active semiconductor devices and to said first terminal of said first impedance device, and wherein said third terminal of each of said first plurality of devices is operably connected to said third terminal of each of said first and second active semiconductor devices and to said second terminal of said first impedance device;

a second plurality of active semiconductor devices each including at least first, second and third terminals wherein said first terminals of said second plurality of devices are each respectively operably connected to a said second terminal of a corresponding device of said first plurality of devices, and wherein said third terminal of each of said second plurality of devices is operably connected to said third terminal of each of said third and fourth active semiconductor devices;

whereby an input current applied to said second terminal of said third device also results in production, at each of said second terminals of said second plurality of devices, of a plurality of output currents that are each a direct function of that input current.

* * * * *

(12) EX PARTE REEXAMINATION CERTIFICATE (4862nd)
United States Patent
Real et al.

(10) Number: US 4,983,929 C1
(45) Certificate Issued: Oct. 14, 2003

(54) CASCODE CURRENT MIRROR

(75) Inventors: Peter Real, Groveland, MA (US); David H. Robertson, Somerville, MA (US)

(73) Assignee: Analog Devices, Inc., Norwood, MA (US)

Reexamination Request:
No. 90/005,830, Oct. 30, 2000

Reexamination Certificate for:
Patent No.: 4,983,929
Issued: Jan. 8, 1991
Appl. No.: 07/413,183
Filed: Sep. 27, 1989

(51) Int. Cl.[7] ............................................. H03F 3/16
(52) U.S. Cl. ........................ 330/288; 330/277; 330/311
(58) Field of Search ................................. 330/277, 288, 330/296, 310, 311; 323/315, 310

(56) References Cited

U.S. PATENT DOCUMENTS

| 4,477,782 A | 10/1984 | Swanson | 330/288 |
|---|---|---|---|
| 4,503,381 A | 3/1985 | Bowers | 323/315 |
| 4,618,815 A | 10/1986 | Swanson | 323/315 |

OTHER PUBLICATIONS

Jacob Millman "Micro–Electronics: Digital and Analog Circuits and Systems" McGraw–Hill, Inc 1979 p. 254.*

Fisher et al., "A 50–Mbit/s CMOS Optical Transmitter Integrated Circuit", pp. 901–908, IEEE Journal of Solid–State Circuits, vol. SC–21, No. 6, (Dec. 1986).

* cited by examiner

*Primary Examiner*—Michael B Shingleton (57) ABSTRACT

A cascoded current mirror device is disclosed that is capable of producing an output current that is a direct function of an input current received by that device. The cascoded current mirror includes at least two portions connected together in a cascode manner. Provision is also made for feedback connection between those portions. This feedback connection can, for example, be a buffering connection. Voltage signals are generated by this device that can be used to drive and control additional output stages. Each such additional output stage is capable of producing an additional output current.

US 4,983,929 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–14 is confirmed.

Claims 15 and 21–28 are cancelled.

Claims 16–20 are determined to be patentable as amended.

New claim 29 is added and determined to be patentable.

16. Apparatus as recited in claim [15] *19*, wherein each of said first, second, third, fourth, [and] fifth, *sixth and seventh* active semiconductor devices[, each] comprises a transistor.

17. Apparatus as recited in claim [15] *19*, wherein:
each of said first, second, third, fourth, [and] fifth, *sixth and seventh* active semiconductor devices [each] comprises a field effect transistor;
said first terminal of each of said active semiconductor devices comprises a source terminal of that device;
said second terminal of *each of* said active semiconductor devices comprise*s* a drain terminal of that device; and
said third terminal of each of said active semiconductor devices comprises a gate terminal of that device.

18. Apparatus as recited in claim [15] *19* wherein:
each of said active semiconductor devices comprises a bipolar transistor;
said first terminal of each of said active semiconductor devices comprises an emitter terminal of that device;
said second terminal of each of said active semiconductor devices comprises a collector terminal of that device; and
said third terminal of each of said active semiconductor devices comprises a base terminal of that device.

19. [Apparatus as recited in claim 15, further comprising:] *Apparatus for producing an output current that is a direct function of an input current received by that apparatus, comprising:*
*a first active semiconductor device including at least first, second and third terminals;*
*a second active semiconductor device including at least first, second and third terminals wherein said first terminal of said first device is operably connected to said first terminal of said second device and wherein said third terminal of said first device is operably connected to said third terminal of said second device;*
*a third active semiconductor device including at least first, second and third terminals wherein said first terminal of said third device is operably connected to said second terminal of said first device, and wherein said second terminal of said third device is operably connected to said third terminal of said first device and to said third terminal of said second device;*
*a fourth active semiconductor device including at least first, second and third terminals wherein said first terminal of said fourth device is operably connected to said second terminal of said second device, wherein said third terminal of said fourth device is operably connected to said third terminal of said third device;*
*a fifth active semiconductor device including at least first, second and third terminals wherein said first terminal of said fifth device is operably connected to said first terminal of each of said first and second devices, and wherein said second and third terminals of said fifth device are operably connected to said third terminal of each of said third and fourth devices;*
a sixth active semiconductor device including at least first, second and third terminals wherein said first terminal of said sixth device is [is] operably connected to said first terminal of each of said first and second devices, and wherein said third terminal of said sixth device is operably connected to said third terminal of each of said first and second devices [and to said first terminal of said fifth device]; and
a seventh active semiconductor device including at least first, second and third terminals wherein said first terminal of said seventh device is operably connected to said second terminal of said sixth device, and wherein said third terminal of said seventh device is operably connected to said third terminal of each of said third and fourth devices;
*whereby an input current applied to said second terminal of said third device results in production at said second terminal of said fourth device of a first output current that is a direct function of that input current; and*
[whereby] an input current applied to said second terminal of said third device [and to said third terminal of said fifth device] also results in production at said second terminal of said seventh device of a second output current that is a direct function of that input current.

20. [Apparatus as recited in claim 15, further comprising:] *Apparatus for producing an output current that is a direct function of an input current received by that apparatus, comprising:*
*a first active semiconductor device including at least first, second and third terminals;*
*a second active semiconductor device including at least first, second and third terminals wherein said first terminal of said first device is operably connected to said first terminal of said second device and wherein said third terminal of said first device is operably connected to said third terminal of said second device;*
*a third active semiconductor device including at least first, second and third terminals wherein said first terminal of said third device is operably connected to said second terminal of said first device, and wherein said second terminal of said third device is operably connected to said third terminal of said first device and to said third terminal of said second device;*
*a fourth active semiconductor device including at least first, second and third terminals wherein said first terminal of said fourth device is operably connected to said second terminal of said second device, wherein said third terminal of said fourth device is operably connected to said third terminal of said third device;*
*a fifth semiconductor device including at least first, second and third terminals wherein said first terminal of* said fifth device is operably connected to said first terminal of each of said first and second devices, and wherein said second and third terminals of said fifth device are operably connected to said third terminal of each of said third and fourth devices;

a first plurality of active semiconductor devices each including at least first, second and third terminals wherein said first terminal of each of said first plurality of devices is operably connected to said first terminal of each of said first and second devices, and wherein said third terminal of each of said first plurality of devices is operably connected to said third terminal of each of said first and second devices [and to said first terminal of said fifth device]; and a second plurality of active semiconductor devices each including at least first, second and third terminals wherein said first terminals of said second plurality of devices are each respectively operably connected to a said second terminal of a corresponding device of said first plurality of devices, and wherein said third terminal of each of said second plurality of devices is operably connected to said third terminal of each of said third and fourth devices;

whereby an input current applied to said second terminal of said third device results in production at said second terminal of said fourth device of a first output current that is a direct function of that input current; and

[whereby] an input current applied to said second terminal of said third device [and to said third terminal of said fifth device] also results in production, at each of said second terminals of said second plurality of devices, of [a plurality of output currents that are each] *an output current that is* a direct function of that input current.

29. *The apparatus of claim 19 wherein the sixth and the seventh active semiconductor devices are scaled such that the first output current is not equal to the second output current.*

\* \* \* \* \*